United States Patent
Ju et al.

(10) Patent No.: US 6,512,244 B1
(45) Date of Patent: Jan. 28, 2003

(54) SOI DEVICE WITH STRUCTURE FOR ENHANCING CARRIER RECOMBINATION AND METHOD OF FABRICATING SAME

(75) Inventors: Dong-Hyuk Ju, Cupertino, CA (US); William G. En, Milpitas, CA (US); Srinath Krishnan, Campbell, CA (US); Xilin Judy An, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/850,392

(22) Filed: May 7, 2001

(51) Int. Cl.$^7$ ................................................. H01L 21/20
(52) U.S. Cl. ....................................................... 257/59
(58) Field of Search ...................... 257/59, 71; 438/149, 438/164, 14

(56) References Cited

U.S. PATENT DOCUMENTS

| | | | |
|---|---|---|---|
| 5,294,821 A | | 3/1994 | Iwamatsu |
| 5,360,752 A | | 11/1994 | Brady et al. |
| 5,578,507 A | * | 11/1996 | Kuroi ........................... 437/24 |
| 6,093,937 A | * | 7/2000 | Yamazaki ..................... 257/59 |
| 6,144,079 A | * | 11/2000 | Shirahata ..................... 257/392 |
| 6,306,691 B1 | * | 10/2001 | Koh ............................. 438/149 |

* cited by examiner

Primary Examiner—John F. Niebling
Assistant Examiner—Andre C. Stevenson
(74) Attorney, Agent, or Firm—Renner, Otto, Boisselle & Sklar, LLP

(57) ABSTRACT

A semiconductor-on-insulator (SOI) device. The SOI device includes an SOI wafer including an active layer, a substrate and a buried insulation layer disposed therebetween. The active layer includes an abrupt region disposed along a lower portion of the active layer, the abrupt region having the same P or N doping type as a doping type of a body region.

12 Claims, 3 Drawing Sheets

SOI DEVICE WITH STRUCTURE FOR ENHANCING CARRIER RECOMBINATION AND METHOD OF FABRICATING SAME

TECHNICAL FIELD

The invention relates generally to semiconductor-on-insulator (SOI) devices and methods for forming the same. The invention relates particularly to an SOI device having structure to reduce floating body effects by enhancing carrier recombination and a method for fabricating the SOI device.

BACKGROUND ART

Traditional semiconductor-on-insulator (SOI) integrated circuits typically have a silicon substrate having a buried oxide (BOX) layer disposed thereon. A semiconductor active layer, typically made from silicon, is disposed on the BOX layer. Within the active layer, active devices, such as transistors, are formed in active regions. The size and placement of the active regions are defined by isolation regions. As a result of this arrangement, the active devices are isolated from the substrate by the BOX layer. More specifically, a body region of each SOI transistor does not have body contacts and is therefore "floating."

SOI chips offer potential advantages over bulk chips for the fabrication of high performance integrated circuits for digital circuitry. Such digital circuitry is typically made from partially-depleted metal oxide semiconductor field effect transistors (MOSFETs). In such circuits, dielectric isolation and reduction of parasitic capacitance improve circuit performance, and virtually eliminate latch-up in CMOS circuits. In addition, circuit layout in SOI can be greatly simplified and the packing density greatly increased.

However, devices formed from SOI materials typically exhibit parasitic effects due to the presence of the floating body (i.e., "floating body effects"). These floating body effects may result in undesirable performance in SOI devices. Therefore, it will be appreciated that a need exists for SOI devices having reduced floating body effects.

SUMMARY OF THE INVENTION

According to one aspect of the invention, the invention is a semiconductor-on-insulator (SOI) device. The SOI device includes an SOI wafer including an active layer, a substrate and a buried insulation layer disposed therebetween, the active layer having isolation regions defining an active region, and a source region, a drain region and a body region disposed therebetween being formed in the active region; a gate disposed on the semiconductor layer above the body region, the gate being operatively arranged with the source, drain and body regions to form a transistor; and wherein the active layer includes an abrupt region disposed along a lower portion of the active layer, the abrupt region having the same P or N doping type as a doping type of the body region.

According to another aspect of the invention, the invention is a method for forming a semiconductor-on-insulator (SOI) device. The method includes the steps of providing an SOI wafer having an active layer, a substrate and a buried insulation layer disposed therebetween; forming isolation regions within the active layer to define an active region; forming a source region, a drain region and a body region disposed therebetween within the active region; forming an abrupt region disposed along a lower portion of the active layer, the abrupt region having the same P or N doping type as a doping type of the body region; and forming a gate disposed on the semiconductor layer above the body region, the gate being operatively arranged with the source, drain and body regions to form a transistor.

BRIEF DESCRIPTION OF DRAWINGS

These and further features of the present invention will be apparent with reference to the following description and drawings, wherein.

DISCLOSURE OF INVENTION

Figure 1:
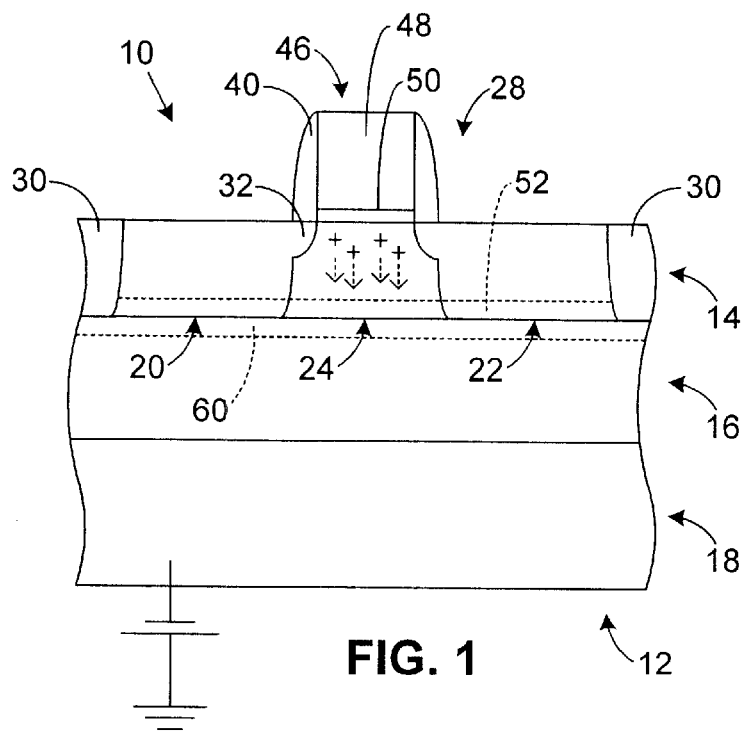
FIG. 1 is a cross-sectional view of a semiconductor-on-insulator (SOI) device in accordance with the present invention.

In the detailed description which follows, identical components have been given the same reference numerals, regardless of whether they are shown in different embodiments of the present invention. To illustrate the present invention in a clear and concise manner, the drawings may not necessarily be to scale and certain features may be shown in somewhat schematic form.

Referring initially to FIG. 1, a semiconductor-on-insulator (SOI) device 10 according to the present invention is shown. The SOI device 10 is fabricated from an SOI wafer 12. The SOI wafer 12 includes an active layer 14 (also referred to as a semiconductor layer 14), a buried insulator layer 16 (also referred to as a buried oxide (BOX) layer 16), and a substrate 18. In one embodiment, the active layer 14 and the substrate 18 are made from silicon, and the BOX layer 16 is made from an oxide, such as silicon oxide or $SiO_2$. The wafer can be formed using techniques such as direct wafer bonding or a separated by implanted oxygen (SIMOX) technique.

Within the active layer 14, isolation regions 30 define the size and placement of an active region 28 in which the SOI device 10 is fabricated. More specifically, within the active region 28 for the SOI device 10, the SOI device 10 includes a source region 20, a drain region 22, and a body region 24 disposed therebetween. In the illustrated embodiment the source region 20 and the drain region 22 have N+ doping and the body 24 has P doping (the illustrated SOI device 10 being an N-channel device). Alternatively, the source region 20, the drain region 22 and the body region 24 can have any other appropriate doping. For example, the source region 20 and the drain region can have P+ doping and the body region 24 can have N doping (this embodiment of the SOI device being a P-channel device). Alternatively, the body region 24 can remain undoped.

The SOI device 10 also has a gate 46 disposed on top of the body region 24. The gate 46 includes a gate electrode portion 48, made from a conductive material such as polysilicon. Disposed between the gate electrode portion 48 and the body region 24 is a gate oxide layer, or gate dielectric 50. The gate dielectric 50 can be formed from a material such as silicon dioxide, silicon oxynitride, silicon nitride ($Si_3N_4$), or the like. Alternatively, other gate stack arrangements, as are known in the art, can be used for the gate 46. Sidewall spacers 40 are disposed adjacent the gate 46. Disposed under the sidewall spacers 40 and respectively as part of the source region 20 and the drain region 24, are extensions 32. The extensions 32, as well as deep implant regions of the source region 20 and the drain region 22, are doped as described above, or as desired by the designer. The extensions 32 can be formed using, for example, a lightly doped drain technique.

The illustrated N-channel SOI device 10 also includes a P+ doped, very abrupt region 52 disposed across a lower portion of the active layer 14, adjacent to the BOX layer 16. As one skilled in the art will appreciate, for a P-channel SOI device 10, the abrupt region 52 will have N+ doping. The abrupt region 52 is disposed at least across the body region 24, or as illustrated, can laterally extend across the entire active region 28 of the SOI device 10.

Figure 1A:
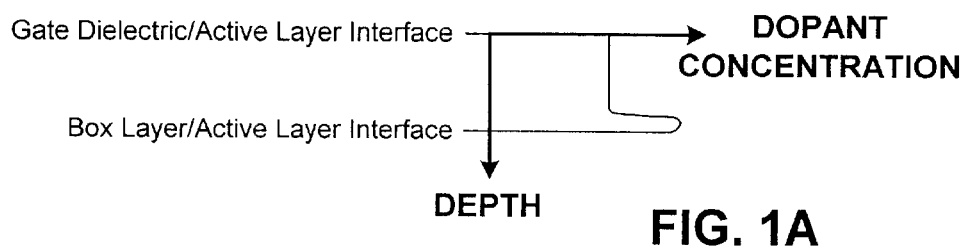
FIG. 1A is doping profile graph of the SOI device of FIG. 1.

FIG. 1A is a doping profile graph of SOI device 10 thickness versus relative doping taken along an imaginary line (not illustrated) drawn vertically through the body region 24. It is noted that the doping profile graph is not shown to scale. The higher doping concentration of the abrupt region 52 creates a "built-in" electric field within the body region 24 which tends to draw excess carriers toward the BOX layer 16. In the illustrated N-channel SOI device 10, the carriers are holes represented by plus signs (+). In a P-channel SOI device 10, the carriers are electrons.

The SOI device 10 also includes an oxide trap region 60 disposed along an upper surface of the BOX layer 16. As discussed in more detail below, the oxide trap region 60 is formed by implanting heavy ions to damage the upper surface of the BOX layer 16 in at least the area under the body region 24 or, as illustrated, by implanting heavy ions laterally across the entire active region of the SOI device 10. The oxide trap region 60 contains oxide traps which promote carrier recombination, thereby removing charge from the body region 24 and reducing floating body effects (FBE).

The carriers are drawn to the oxide trap region 60 by a bias potential (e.g., having an absolute valve of about 2 V to about 10 V) applied to the substrate 18. For an N-channel device, the bias potential is negative (as illustrated) and for a P-channel device, the bias potential is positive. Carriers will also be drawn to the oxide trap region 60 by the presence of the abrupt region 52, as described in more detail above.

Figure 2:
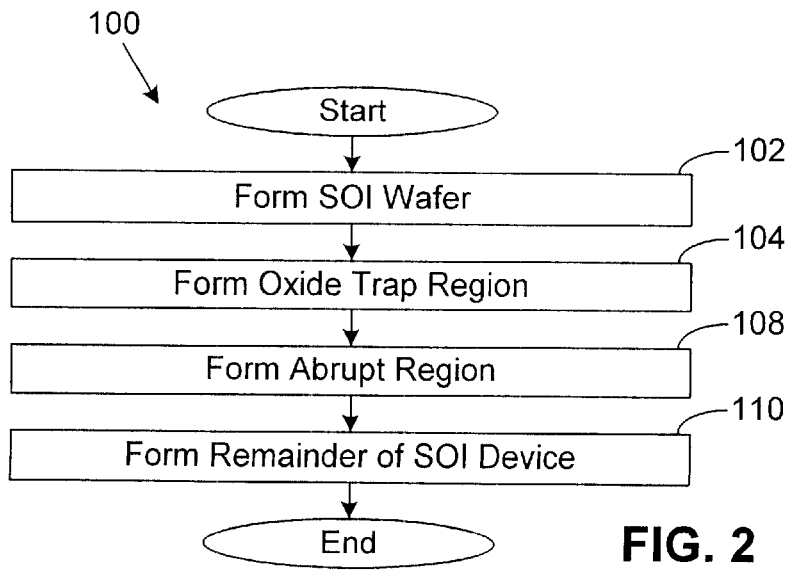
FIG. 2 is a flow chart of a method of making the SOI device of FIG. 1.
Figure 3:
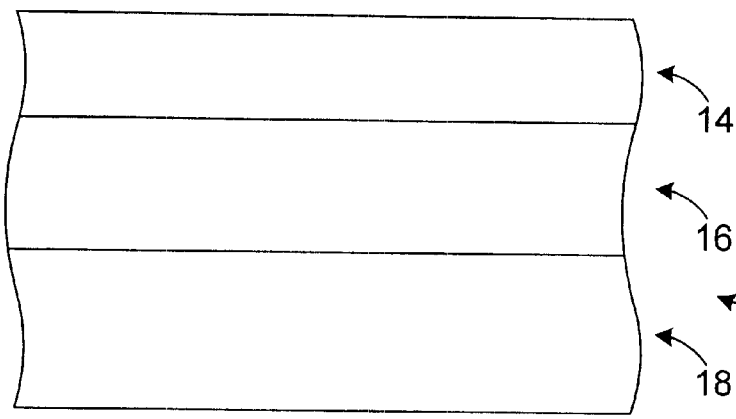
FIGS. 3–6 are cross-sectional views of the SOI device in various stages of fabrication.

FIG. 2 is a flow chart of a method 100 for fabricating the SOI device 10. Initially, at step 102 and as illustrated in FIG. 3, the SOI wafer 12 is formed using techniques known in the art such as wafer bonding or SIMOX. The SOI wafer 110 includes the substrate 18, the BOX layer 16 and the active layer 14. The active layer 14 may be suitably doped for the formation of an N-channel device, as is illustrated, or a P-channel device.

Figure 4:
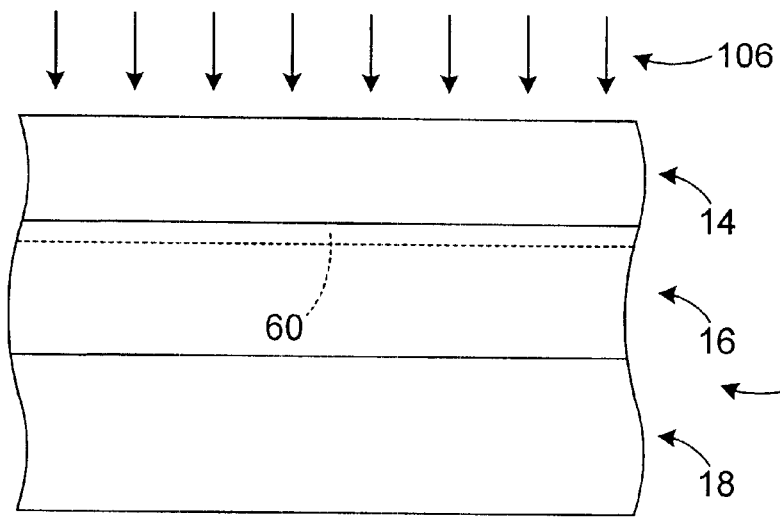

In step 104, and as illustrated in FIG. 4, the oxide trap region is formed by implanting heavy ions 106 into the wafer 12. More specifically, the ions are implanted with an energy so that the majority of the ions traverse the active layer 14 to impinge upon and damage an upper surface of the BOX layer 16, thereby forming oxide traps at or near the upper surface of the BOX layer 16. Exemplary ions for implantation include indium (In) for an N-channel device; arsenic (As) or antimony (Sb) for a P-channel device; and germanium (Ge) or xenon (Xe) for either an N-channel or P-channel device.

The energy level and doping concentration for heavy ions implantation are sufficient to create the above-described oxide trap region 60 at or near the surface of the BOX layer 16. Suitable ranges of energy levels and doping concentrations for the heavy ions may be determined empirically and will depend upon factors such as the type of heavy ion, the thickness of the active layer 14 and the like. For the ions species indium, arsenic, antimony, germanium and xenon, and for a typical active layer 14 having a thickness of about 500 Å to about 2000 Å, an exemplary energy range for the heavy ion implantation is about 100 keV to about 300 keV, and an exemplary dosage range is between about $1\times10^{14}$ to about $1\times10^{16}$ atoms/cm$^2$. It will be appreciated that during ion implantation, incidental damage to the active layer 14 may occur. This incidental damage is not necessarily a concern, but can be minimized by optimizing the implantation energy and dose of the heavy ions.

In an alternative embodiment of the invention, the active layer 14 can be masked before ion implantation to control the size, shape and placement of the oxide trap region 60. For example, the active layer 14 can be masked by depositing or growing a layer of mask material on the active layer 14 and then patterning the mask material to form a window which leaves the active layer 14 exposed in an area where oxide trap region 60 formation is desired, such as localized under the eventual body region 24.

Figure 5:
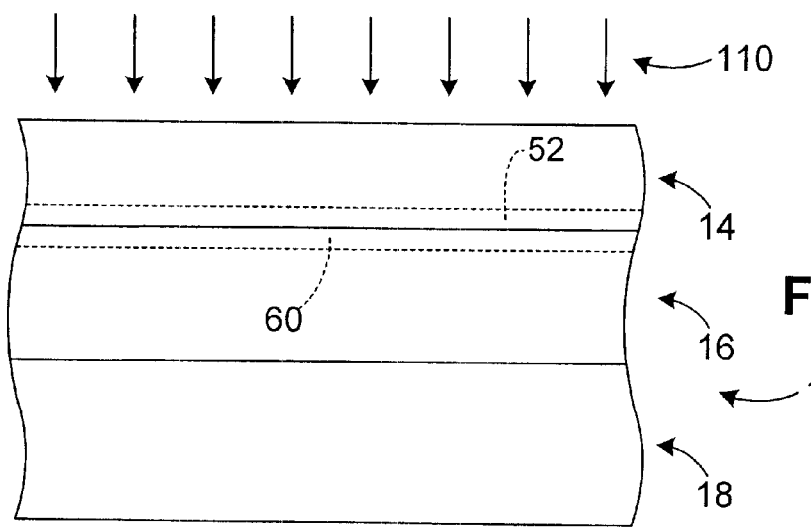

In step 108, and as illustrated in FIG. 5., ions 110 are implanted to form the abrupt region 52. For an N-channel device, exemplary ions to form a P+ abrupt region 52 include indium. For a P-channel device, exemplary ions for a N+ abrupt region 52 include arsenic and antimony. The energy and dosage of the implantation depends on the type of ion being implanted, the thickness of the active layer 14 and so forth. As an example, for implantation of indium into a active layer 14 having a thickness of about 500 Å to about 2,000 Å, an exemplary energy range is about 80 keV to about 150 keV and an exemplary dosage range is about $1\times10^{14}$ atoms/cm$^2$ to about $1\times10^{16}$ atoms/cm$^2$.

In an example embodiment of an N-channel device having a P+ abrupt region 52, the dopant concentration within the P+ abrupt region 52, is about $1\times10^{19}$ atoms/cm$^3$ to about $1\times10^{20}$ atoms/cm$^3$ where the remainder of the body region 24 has a concentration of about $1\times10^{17}$ atoms/cm$^3$ to about $5\times10^{18}$ atoms/cm$^3$.

The abrupt region 52 has a thickness which generally depends on the thickness of the active layer 14. However, the thickness of the abrupt region 52 is generally less than one-third (⅓) the thickness of the active layer 14.

Figure 6:
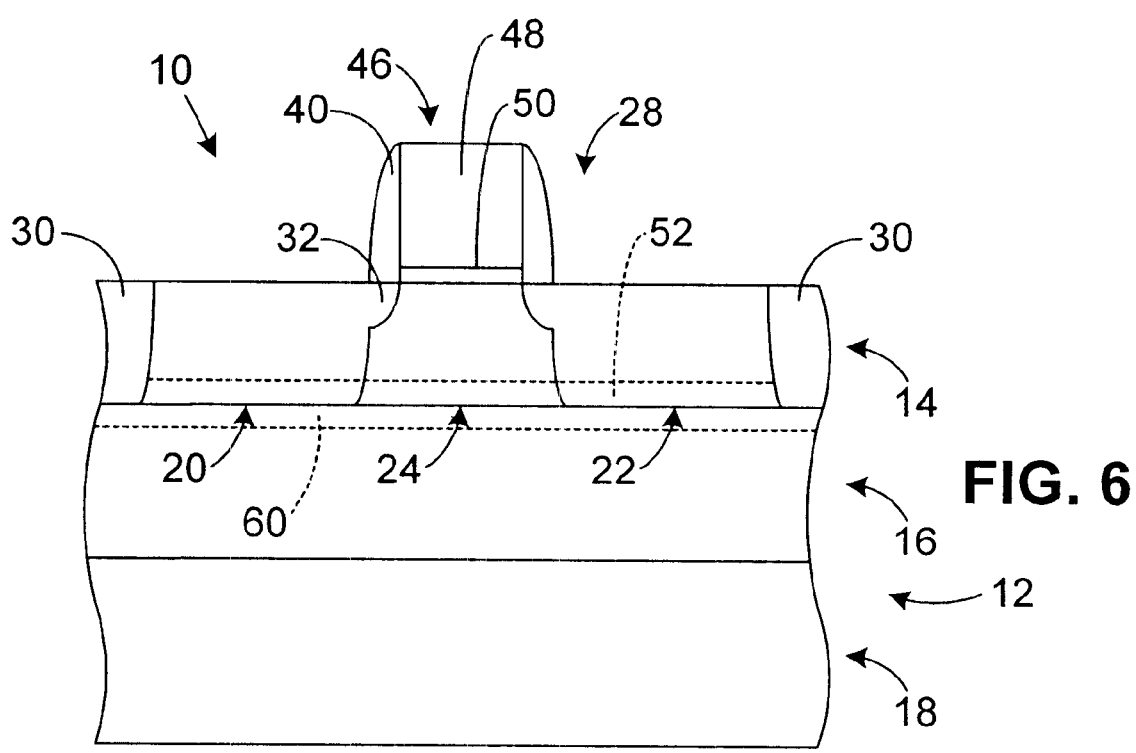

Next, in step 112 and as illustrated in FIG. 6, the rest of the components for the SOI device 10 are formed. The formation of the remainder of the SOI device 10 will be well known to those skilled in the art and, therefore, will not be discussed in great detail. Step 112 includes formation of the isolation regions 30, such as by the formation of shallow trench isolation areas. It is noted that formation of the isolation regions 30 can be conducted before steps 104 and/or 108.

Step 112 also includes gate 46 formation by growing or depositing a layer of gate dielectric and forming the gate electrode 46 thereon. Next, the extensions 32 can be formed by implanting, for example, phosphorous or arsenic to establish N-type doping, or by implanting boron to achieve P-type doping. The extensions 32 can be formed using a lightly doped drain (LDD) technique as is well known in the art. As will be appreciated, the gate 46 acts as a self-aligned mask when forming the extensions 32. Next, the sidewall spacers 40 are deposited using conventional techniques and the source 20 and drain 22 are implanted with deep implants as is well known in the art. For example, to achieve N-type doping, phosphorous or arsenic may be implanted, and to achieve P-type doping, boron may be implanted. A thermal cycle to recrystalize the active layer 14 and to activate the dopants can be carried out. Exemplary thermal cycles include low temperature annealing or rapid thermal annealing (RTA).

Although particular embodiments of the invention have been described in detail, it is understood that the invention is not limited correspondingly in scope, but includes all changes, modifications, and equivalents, within the spirit and terms of the claims appended hereto.

For example, the formation of the oxide trap region 52 in step 104 can be carried out after formation of the abrupt region 52 in step 108.

As another example, formation of the abrupt region 52 can be omitted.

In another embodiment of the invention, the substrate can be grounded rather than being coupled to a positive or negative bias as described above.

What is claimed is:

1. A semiconductor-on-insulator (SOI) device, comprising:
    an SOI wafer including an active layer, a substrate and a buried insulation layer disposed therebetween, the active layer having isolation regions defining an active region, and a source region, a drain region and a body region disposed therebetween being formed in the active region;
    a gate disposed on the semiconductor layer above the body region, the gate being operatively arranged with the source, drain and body regions to form a transistor; and
    wherein the body region includes an abrupt region disposed along a lower portion of the active layer, the abrupt region having a doping concentration that is greater than a doping concentration of an upper portion of the body region and the abrupt region having opposite P-type or N-type doping as the source and drain regions and wherein the upper portion of the body region has a doping concentration of about $1\times10^{17}$ atoms/cm$^3$ to about $5\times10^{18}$ atoms/cm$^3$ and the abrupt region has a doping concentration of about $1\times10^{19}$ atoms/cm$^3$ to about $1\times10^{20}$ atoms/cm$^3$.

2. The SOI device according to claim 1, wherein the body has N-type doping and the abrupt region is formed by implanting ions selected from arsenic and antimony.

3. The SOI device according to claim 1, wherein the body has P-type doping and the abrupt region is formed by implanting indium ions.

4. The SOI device according to claim 1, wherein the buried insulation layer includes an oxide trap region disposed along an upper surface of the buried insulation layer, the oxide trap region having a plurality of oxide traps to promote carrier recombination.

5. The SOI device according to claim 4, wherein the substrate is coupled to a bias potential, the bias potential selected for the doping type of the body region.

6. The SOI device according to claim 4, wherein the oxide trap region is confined to an area under the body region.

7. A semiconductor-on-insulator (SOI) device, comprising:
    an SOI wafer including an active layer, a substrate and a buried insulation layer disposed therebetween, the active layer having isolation regions defining an active region, and a source region, a drain region and a body region disposed therebetween being formed in the active region;
    a gate disposed on the semiconductor layer above the body region, the gate being operatively arranged with the source, drain and body regions to form a transistor; and
    wherein the active layer includes an abrupt region disposed along a lower portion of the active layer, the abrupt region having the same P or N doping type as a doping type of the body region and the body region has a doping concentration of about $1\times10^{17}$ atoms/cm$^3$ to about $5\times10^{18}$ atoms/cm$^3$ and the abrupt region has a doping concentration of about $1\times10^{19}$ atoms/cm$^3$ to about $1\times10^{20}$ atoms/cm$^3$.

8. A semiconductor-on-insulator (SOI) device, comprising:
    an SOI wafer including an active layer, a substrate and a buried insulation layer disposed therebetween, the active layer having isolation regions defining an active region, and a source region, a drain region and a body region disposed therebetween being formed in the active region;
    a gate disposed on the semiconductor layer above the body region, the gate being operatively arranged with the source, drain and body regions to form a transistor;
    wherein the body region includes an abrupt region disposed along a lower portion of the active layer, the abrupt region having a doping concentration that is greater than a doping concentration of an upper portion of the body region and the abrupt region having opposite P-type or N-type doping as the source and drain regions; and
    wherein the buried insulation layer includes an oxide trap region disposed along an upper surface of the buried insulation layer, the oxide trap region having a plurality of oxide traps to promote carrier recombination and wherein the oxide trap region is formed by heavy ion implantation.

9. The SOI device according to claim 8, wherein the body region has P-type doping and the implanted ions to form the oxide trap region are selected from indium, germanium and xenon.

10. The SOI device according to claim 8, wherein the body region has N-type doping and the implanted ions to form the oxide trap region are selected from arsenic, antimony, germanium and xenon.

11. The SOI device according to claim 8, wherein the substrate is coupled to a bias potential, the bias potential selected for the doping type of the body region.

12. The SOI device according to claim 8, wherein the oxide trap region is confined to an area under the body region.

\* \* \* \* \*